(12) United States Patent
Nakayama et al.

(10) Patent No.: US 10,120,095 B2
(45) Date of Patent: Nov. 6, 2018

(54) PROXIMITY SWITCH

(71) Applicant: OMRON Corporation, Kyoto (JP)

(72) Inventors: Yusuke Nakayama, Fukuchiyama (JP); Hiroyuki Tsuchida, Ayabe (JP); Ryota Hasegawa, Ayabe (JP); Takuya Okamoto, Fukuchiyama (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 15/381,112

(22) Filed: Dec. 16, 2016

(65) Prior Publication Data

US 2017/0212265 A1 Jul. 27, 2017

(30) Foreign Application Priority Data

Jan. 22, 2016 (JP) .................................. 2016-011003

(51) Int. Cl.
*G01V 3/10* (2006.01)
*G01D 5/20* (2006.01)
*H03K 17/95* (2006.01)

(52) U.S. Cl.
CPC ............. *G01V 3/10* (2013.01); *G01D 5/2006* (2013.01); *H03K 17/952* (2013.01); *H03K 17/9545* (2013.01); *H03K 17/9547* (2013.01)

(58) Field of Classification Search
CPC ...... G01D 5/142; G01D 5/145; G01D 5/2033; G01D 5/2241; G01B 5/0011;
(Continued)

(56) References Cited

U.S. PATENT DOCUMENTS

2004/0047106 A1* 3/2004 Maruyama ............. G01N 27/72
361/143
2009/0140727 A1* 6/2009 Rollins .................. G01B 7/023
324/207.16
(Continued)

FOREIGN PATENT DOCUMENTS

JP       H04304020       10/1992
JP       H05164742       6/1993
(Continued)

OTHER PUBLICATIONS

"Search Report of Euorpean Counterpart Application", dated Jul. 6, 2017, p. 1-p. 9.
(Continued)

*Primary Examiner* — Tung X Nguyen
*Assistant Examiner* — Robert P Alejnikov, Jr.
(74) *Attorney, Agent, or Firm* — JCIPRNET

(57) ABSTRACT

The present invention provides a proximity switch, which can detect whether a detected object containing multiple metals exists in a specific range. The induction type proximity switch includes: an oscillation switch of which the amplitude is attenuated due to the proximity of the detected object containing metal, so as to detect the excessive proximity of the detected object; a detection circuit for detecting the amplitude of a high frequency generated by the oscillation of the oscillation circuit; an operation and comparison part for comparing the detected amplitude of the high frequency with the threshold set for the amplitude, i.e., a boundary as the excessive proximity, and outputting a detection signal of the excessive proximity when the detected amplitude is under the threshold; and a threshold setting part, for selecting a threshold corresponding to a designated metal type according to the designation on the metal type from the outside.

9 Claims, 7 Drawing Sheets

(58) Field of Classification Search
CPC ........ G01B 9/02058; G01B 7/00; G01B 7/14;
G01B 7/30; G01C 15/14; G01J 1/4228;
G01R 33/02; B60W 2420/506; G06K
7/082; H05K 2201/086; Y10S 336/00
USPC .... 324/207.11, 207.12, 207.13, 207.15, 260,
324/679
See application file for complete search history.

(56) References Cited

U.S. PATENT DOCUMENTS

| | | | | |
|---|---|---|---|---|
| 2012/0081107 | A1* | 4/2012 | Fitch | G01B 7/023 324/207.15 |
| 2014/0015329 | A1* | 1/2014 | Widmer | G01D 5/2006 307/104 |
| 2014/0117979 | A1* | 5/2014 | Heimlicher | H03K 17/9505 324/207.16 |

FOREIGN PATENT DOCUMENTS

| | | |
|---|---|---|
| JP | H0629811 | 2/1994 |
| JP | H0729466 | 1/1995 |
| JP | H09238064 | 9/1997 |
| JP | 2000329858 | 11/2000 |
| JP | 2002014175 | 1/2002 |
| JP | 2007203250 | 8/2007 |
| JP | 2010164472 | 7/2010 |

OTHER PUBLICATIONS

"Office Action of Japan Counterpart Application," dated Jun. 19, 2018, with English translation thereof, p. 1-p. 11.
"Office Action of European Counterpart Application," dated Sep. 6, 2018, p. 1-p. 6.

* cited by examiner

PROXIMITY SWITCH

CROSS-REFERENCE TO RELATED APPLICATION

This application claims the priority benefit of Japanese application serial no. 2016-011003, filed on Jan. 22, 2016. The entirety of the above-mentioned patent application is hereby incorporated by reference herein and made a part of this specification.

BACKGROUND OF THE INVENTION

1. Field of the Invention

The present invention relates to a proximity switch having an oscillation switch and used for detecting whether a detected object exists in a specific range, the oscillation switch oscillates to generate a high frequency, and due to the proximity of the detected object containing metal, the amplitude of the high frequency is attenuated or an oscillation frequency is increased.

2. Description of Related Art

In order to improve the operation rate of a manufacture line, it is required to know the change of the manufacture line in advance, and maintain before a fault or halt.

Usually, there are following examples: an induction type proximity switch as the proximity switch detects the excessive proximity of the detected object containing metal and outputs, so as to prevent the detected object from colliding against the induction type proximity switch.

For example, the proximity switch having an oscillation circuit oscillating at a fixed frequency disclosed in patent document 1. According to the oscillation circuit, the values of a resistor and a condenser are properly set, such that the oscillation frequency can be changed according to the distance to the detected object. In addition, the existence of the object is judged by using such oscillation circuit, or an excessive proximity state of the object can be detected by using an excessive proximity detecting part according to the change of the oscillation frequency.

EXISTING TECHNICAL DOCUMENT

Patent Document

Patent document 1: Japanese Patent laid-open No. 6-29817 Gazette (disclosed on Feb. 4, 1994)

SUMMARY OF THE INVENTION

Problem to be Solved by the Present Invention

However, in the traditional proximity switches, according to the material of the detected object, the range of the required excessive proximity is different, and stable detection on the excessive proximity cannot be realized.

Therefore, in the proximity switch disclosed in patent document 1, in order to cancel the influence caused by the difference, i.e., the metal type, of the detected object, there is provided the following solution, i.e., the change rate of the oscillation frequency is same relative to the detected object, as a target, of all metal varieties.

However, in the proximity switch disclosed in the traditional patent document 1, under the condition that one oscillation frequency is set in a manner that the change rate of the oscillation becomes the same relative to multiple metals, the following problem exists, i.e., the sensitivity cannot be optimized when the detected object as the target is detected.

In addition, in the proximity switch, if the distance to the detected object in the detection distance is not in a stable detection range, then there is no stability in detection. Therefore, whether the distance to the detected object in the detected distance is in the stable detection range, on the other hand, whether the distance to the detected object in the detected distance is detected in an instable detection range is also important. Besides, in the detection that whether the distance to the detected object in the detected distance is detected in an instable detection range, if the metal type is different, then it is indicated that distances of the boundaries of the stable detection range and the instable detection range are also different.

Therefore, in the proximity switch, there is a problem that the high sensitivity cannot be kept under the conditions that whether the excessive proximity of the detected object exists, whether the detected object exists in the instable detection range, or whether the detected object containing multiple metals is detected in the specific range.

The present invention is accomplished considering the conventional problem, and aims to provide a proximity switch, and for the detected object, as a target, containing metal metals, whether the detected object is in the specific range can be detected in a detection range of high detection sensitivity.

Means to Solve the Problem

In order to solve the problem, the proximity switch of the present invention detects whether the detected object is in the specific range by the proximity of the detected object containing metal, and the proximity switch is characterized by comprising: a detection part, for detecting a physical quantity which is changed according to the distance to the detected object; a comparison part, for comparing the detected physical quantity and a threshold set for the physical quantity corresponding to a boundary of the specific range, and outputting a detection signal of the specific range when the detected object exists in the specific range; and a threshold setting part, for selecting the threshold corresponding to the designated metal type according to the designation on the metal type from the outside. In addition, the outside refers to the outside of the proximity switch. For example, the following conditions are included: i.e., a communication part is used in the proximity switch to designate the metal type through communication. In addition, in the present invention, the comparison part and the threshold setting part are unnecessarily disposed on the body of the proximity switch and can be arranged in an external device.

According to the invention, the proximity switch detects whether the detected object is in the specific range by the proximity of the detected object containing metal.

In such proximity switch, when whether the detected object is in the specific range is detected, under the condition that the detected object, as a target, containing multiple metals, corresponding to the metal type, the output physical quantities are different. Accordingly, conventionally, for many metals, the excessive proximity is judged with the same physical quantity, and therefore the detection range with high sensitivity cannot be selected specific to such metal type.

On the contrary, in the present invention, a threshold setting part capable of selecting the threshold corresponding to the metal type is arranged. In addition, regarding the threshold corresponding to the metal type, the threshold corresponding to the metal type can be selected as long as the metal type can be designated from the outside.

Therefore, under the condition of detecting whether the detected object is in the specific range, the physical quantity is detected by using the detection part. Further, the comparison part compares the detected physical quantity with the threshold set for the physical quantity corresponding to a boundary of the specific range, and when the detected object exists in the specific range, a detection signal of the specific range is output. In addition, the threshold is a threshold corresponding to the metal type provided by the threshold setting part.

As a result, in the present invention, since the threshold corresponding to each metal type is used, the threshold may not be the same physical quantity relative to multiple metals. Therefore, specific to multiple metals, the threshold can be set in the detection range with high sensitivity in each metal to detect the excessive proximity, etc.

Therefore, there is provided a proximity switch, which can detect whether the detected object is within the specific range in the detection range with high sensitivity for the detected object, as a target, containing multiple metals.

Besides, the proximity switch of the present invention is a proximity switch mentioned above, and comprises an oscillation circuit which oscillates to generate a high frequency, due to the proximity of the detected object containing metal, the amplitude of the high frequency serving as the physical quantity is attenuated or the oscillation frequency serving as the physical quantity is increased or reduced, and the detection part detects the amplitude of the high frequency generated by the oscillation of the oscillation circuit or the oscillation frequency.

Accordingly, the proximity switch has an oscillation circuit, which oscillates to generate the high frequency, due to the proximity of the detected object containing the metal, and the amplitude of the high frequency is attenuated or the oscillation frequency is increased or reduced, such that whether the detected object exists in the specific range is detected.

Therefore, under the condition of detecting whether the detected object exists in the specific range, the amplitude of the high frequency generated by the oscillation of the oscillation circuit or the oscillation frequency is detected by using the detection part. Further, the comparison part compares the detected amplitude or oscillation frequency of the high frequency with the threshold set for the amplitude or oscillation frequency corresponding to a boundary of the specific range, and the detection signal of the specific range is output when the detected object is in the specific range. Herein, the threshold is a threshold corresponding to the metal type provided by the threshold setting part.

As a result, in the present invention, since the threshold corresponding to each metal type is used, the threshold may not be the same amplitude or oscillation frequency relative to multiple metals. Therefore, specific to multiple metals, the threshold can be set in the detection range with high sensitivity in each metal to detect the excessive proximity.

Therefore, there is provided a proximity switch, which can detect whether the detected object is within the specific range in the detection range with high sensitivity for the detected object, as a target, containing multiple metals.

Besides, the proximity switch of the present invention is a proximity switch mentioned above, and comprises one or more detection coils, due to the proximity of the detected object containing metal, the voltage serving as the physical quantity is increased, and the detection part detects a voltage generated in the detection coil.

Therefore, the proximity switch has one or more detection coils of which the voltage is increased due to the proximity of the detected object containing metal, and whether the detected switch is within the specific range is detected.

Therefore, under the condition of detecting whether the detected object exists in the specific range, the voltage output from the detection coils is detected by using the detection part. Further, the comparison part compares the detected voltage with the threshold set for the voltage corresponding to a boundary of the specific range, and the detection signal of the specific range is output when the detected object is in the specific range. Herein, the threshold is a threshold corresponding to the metal type provided by the threshold setting part.

As a result, in the present invention, since the threshold corresponding to each metal type is used, the threshold may not be the same voltage relative to multiple metals. Therefore, specific to multiple metals, the threshold can be set in the detection range with high sensitivity in each metal to detect the excessive proximity.

Therefore, there is provided a proximity switch, which can detect whether the detected object is within the specific range in the detection range with high sensitivity for the detected object, as a target, containing multiple metals.

Besides, the proximity switch of the present invention is a proximity switch mentioned above, wherein the specific range is a range that the distance to the detected object reaches the excessive proximity, the comparison part compares the detected amplitude or oscillation frequency of the high frequency with the threshold set for the amplitude or oscillation frequency corresponding to a boundary of excessive proximity, i.e., the threshold for excessive proximity, when the detected amplitude is under the threshold for excessive proximity, or when the oscillation frequency detected under the condition that the oscillation frequency is increased along with the proximity of the detected object is over the threshold for excessive proximity, or when the oscillation frequency detected under the condition that the oscillation frequency is reduced along with the proximity of the detected object is under the threshold for excessive proximity, an excessive proximity detection signal serving as a detection signal of the specific range is output. In addition, the excessive proximity refers to that the detected object approaches to a predetermined distance, and therefore the output of the excessive proximity state of the proximity switch in excessive proximity is changed from a switching off state to a switching on state.

Therefore, the proximity switch detects whether the distance to the detected object reaches the range of excessive proximity.

At this point, the detection part is used to detect the amplitude of the high frequency generated by the oscillation of the oscillation circuit or the oscillation frequency. Further, the comparison part compares the detected amplitude or oscillation frequency of the high frequency with the threshold set for the amplitude or oscillation frequency corresponding to a boundary of excessive proximity, i.e., the threshold for excessive proximity, when the detected amplitude is under the threshold for excessive proximity, or when the oscillation frequency detected under the condition that the oscillation frequency is increased along with the proximity of the detected object is over the threshold for excessive proximity, or when the oscillation frequency detected under the condition that the oscillation frequency is reduced along with the proximity of the detected object is under the threshold for excessive proximity, the excessive proximity detection signal as a detection signal of the specific range is output. Herein, the threshold is a threshold for excessive proximity corresponding to the metal type provided by the threshold setting part.

As a result, in the present invention, since the threshold for excessive proximity corresponding to each metal type is used, the threshold for excessive proximity may not be the same amplitude or oscillation frequency relative to multiple metals. Therefore, specific to multiple metals, the threshold for excessive proximity can be set in the detection range with high sensitivity in each metal to detect the excessive proximity.

Therefore, there is provided a proximity switch, which can detect the excessive proximity in the detection range with high sensitivity for the detected object, as a target, containing multiple metals under the condition that the physical quantity is high frequency amplitude or oscillation frequency.

Besides, the proximity switch of the present invention is a proximity switch mentioned above, wherein the specific range is a range that the distance to the detected object becomes an instable detection range in a detected distance, the comparison part compares the detected amplitude or oscillation frequency of the high frequency with the threshold set for the corresponding amplitude or oscillation frequency as a boundary of the instable detection range in the detected distance, i.e., the threshold for instability detection, when the detected amplitude is over the threshold for instability detection, or when the oscillation frequency detected under the condition that the oscillation frequency is increased along with the proximity of the detected object is under the threshold for instability detection, or when the oscillation frequency detected under the condition that the oscillation frequency is reduced along with the proximity of the detected object is over the threshold for instability detection, a signal of being within an instable range serving as the detection signal of the specific range is output.

At this point, the detection part is used to detect the amplitude or oscillation frequency of the high frequency generated by the oscillation of the oscillation circuit. Further, the comparison part compares the detected amplitude or oscillation frequency of the high frequency with the threshold set for the amplitude or oscillation frequency corresponding to a boundary of the instable detection range in the detected distance, i.e., the threshold for instability detection, when the detected amplitude is over the threshold for instability detection, or when the oscillation frequency detected under the condition that the oscillation frequency is increased along with the proximity of the detected object is under the threshold for instability detection, or when the oscillation frequency detected under the condition that the oscillation frequency is reduced along with the proximity of the detected object is over the threshold for instability detection, a signal of being within the instable detection range serving as a detection signal of the specific range is output. Herein, the threshold is a threshold for instability detection corresponding to the metal type provided by the threshold setting part.

As a result, in the present invention, since the threshold for instability detection corresponding to each metal type is used, the threshold for instability detection may not be the same amplitude or oscillation frequency relative to multiple metals. Therefore, specific to multiple metals, the threshold for instability detection can be set in the detection range with high sensitivity in each metal to detect the instable detection range.

Therefore, there is provided a proximity switch, which can detect the instable detection range in the detection range with high sensitivity for the detected object, as a target, containing multiple metals under the condition that the physical quantity is high frequency amplitude or oscillation frequency.

Besides, the proximity switch of the present invention is a proximity switch mentioned above, wherein the specific range is a range that the distance to the detected object reaches the excessive proximity, the comparison part compares the detected voltage with the threshold set for the voltage corresponding to a boundary of the excessive proximity, i.e., the threshold for excessive proximity, when the detected amplitude is over the threshold for excessive proximity, the excessive proximity detection signal serving as a detection signal of the specific range is output.

Therefore, the proximity switch detects whether the distance to the detected object is in the range up to the excessive proximity.

At this point, the detection part is used to detect the voltage output from the detection coils. Further, the comparison part compares the detected voltage with the threshold set for the voltage corresponding to a boundary of the excessive proximity, i.e., the threshold for excessive proximity, when the detected amplitude is over the threshold for excessive proximity, the excessive proximity detection signal serving as a detection signal of the specific range is output. Herein, the threshold is a threshold for excessive proximity corresponding to the metal type provided by the threshold setting part.

As a result, in the present invention, since the threshold corresponding to each metal type is used, the threshold for excessive proximity may not be the same voltage relative to multiple metals. Therefore, specific to multiple metals, the threshold for excessive proximity can be set in the detection range with high sensitivity in each metal to detect the excessive proximity.

Therefore, there is provided a proximity switch, which can detect excessive proximity in the detection range with high detection sensitivity for the detected object, as a target, containing multiple metals under the condition that the physical quantity is voltage.

Besides, the proximity switch of the present invention is the proximity switch as mentioned above, wherein the specific range is a range that the distance to the detected object becomes an instable detection range in a detection distance, and the comparison part compares the detected voltage with the threshold set for the voltage corresponding to a boundary of the instable detection range in the detected distance, i.e., the threshold for instability detection, when the detected voltage is under the threshold for instability detection, a signal of being within the instable range serving as a detection signal of the specific range is output.

At this point, the detection part is used to detect the voltage output from the detection coils. Further, the comparison part compares the detected voltage with the threshold set for the voltage corresponding to a boundary of the instable detection range in the detected distance, i.e., the threshold for instability detection, when the detected voltage is over the threshold for instability detection, a signal in the instable range as a detection signal of the specific range is output. Herein, the threshold is a threshold for instability detection corresponding to the metal type provided by the threshold setting part.

As a result, in the present invention, since the threshold for instability detection corresponding to each metal type is used, the threshold for instability detection may not be the same voltage relative to multiple metals. Therefore, specific to multiple metals, the threshold for instability detection can be set in the detection range with high sensitivity in each metal to detect the instable detection range.

Therefore, there is provided a proximity switch, which can detect the instable detection range in the detection range with high detection sensitivity for the detected object, as a target, containing multiple metals under the condition that the physical quantity is voltage.

Besides, the proximity switch of the present invention is the proximity switch as mentioned above, wherein preferably, the thresholds in the threshold setting part can be changed corresponding to the metal type and the distance preset for excessive proximity or the distance preset for the instable detection range, and according to the designation for the metal type and the distance preset for excessive proximity or the distance preset for the instable detection range from the outside, the corresponding threshold for excessive proximity or threshold for instability detection is set.

Therefore, the threshold for excessive proximity can be changed corresponding to the metal type and the distance preset for the excessive proximity when the excessive proximity is judged. Besides, the threshold for instability detection can be changed corresponding to the metal type and the distance preset for the instable detection range when the instable detection range is judged. As a result, the proximity switch with high convenience can be provided.

Besides, the proximity switch of the present invention is the proximity switch mentioned above, which, preferably, comprises a storage part, which stores multiple combinations of the metal type and the distance preset for excessive proximity and the distance preset for the instable detection range, and the threshold for excessive proximity or the threshold for instability detection corresponding to each combination, and according to the designation of the combination of the metal type and the distance preset for excessive proximity or the distance preset for the instable detection range from the outside, the corresponding threshold for excessive proximity or the threshold for instability detection is selected.

Therefore, the threshold for excessive proximity can be automatically selected by designating the combination of the metal type and the distance preset for the excessive proximity from the outside through communication when the threshold for excessive proximity is changed by the multiple combinations corresponding to the metal type and the distance preset for excessive proximity when the excessive proximity is judged.

Besides, the threshold for instability detection can be automatically selected by designating the combination of the metal type and the distance preset for the instable detection range from the outside through communication when the threshold for instability detection is changed by the multiple combinations corresponding to the metal type and the distance preset for the instable detection range when the instable detection range is judged.

As a result, a user will not mistakenly set the threshold for excessive proximity or the threshold for instability detection with a distance longer than the detection distance of the object, such that error processing is not required.

Besides, the proximity switch of the present invention is the proximity switch mentioned above, wherein preferably, the threshold setting part is connected to a communication part for communication with the outside by using IO-Link communication.

Therefore, the communication part communicates with the outside by using IO-Link communication. As a result, light weight of the proximity switch can be realized since the IO-Link communication can also realize power supply.

In addition, the proximity switch of the present invention is the proximity switch mentioned above, wherein preferably, the oscillation circuit adopts a soft oscillation manner that the amplitude of the high frequency during the excessive proximity of the detected object is kept in a nonstop state.

Therefore, the condition that the high frequency oscillation is in a stop state and cannot be detected in the position of the distance of excessive proximity is prevented.

Besides, the proximity switch of the present invention is the proximity switch mentioned above, which, preferably, is provided with an alarm part for alarming when the comparison part outputs the detection signal of the specific range.

Therefore, by using the alarm part, the excessive proximity or instable range is alarmed to the outside, such that the user can easily distinguish that the detected object excessively approaches to or is in the instable range.

Effects of the Invention

According to one form of the present invention, the following effects are achieved: there is provided a proximity switch, which can detect whether the detected object exists in a specific range in the detection range with high detection sensitivity for the detected object, as a target, containing multiple metals.

DESCRIPTION OF THE EMBODIMENTS

Embodiment 1

The embodiment of the present invention is explained based on FIGS. 1-6.

The proximity switch of the present invention has an oscillation circuit, which detects the excessive proximity of a detected object, the oscillation circuit oscillates to generate a high frequency, and due to the proximity of the detected object containing metal, the amplitude of the high frequency is reduced or the oscillation frequency is increased.

Herein, in the embodiment, the proximity switch is explained with a manner of detecting by the changes of the impedance of coils, amplitude or an oscillation frequency.

In this embodiment, an induction type proximity switch as the proximity switch is especially explained, the induction type proximity switch has an oscillation circuit, which detects the excessive proximity of the detected object, and the oscillation circuit oscillates to generate a high frequency, and due to the proximity of the detected object containing metal, the amplitude of the high frequency is attenuated.

Figure 1:
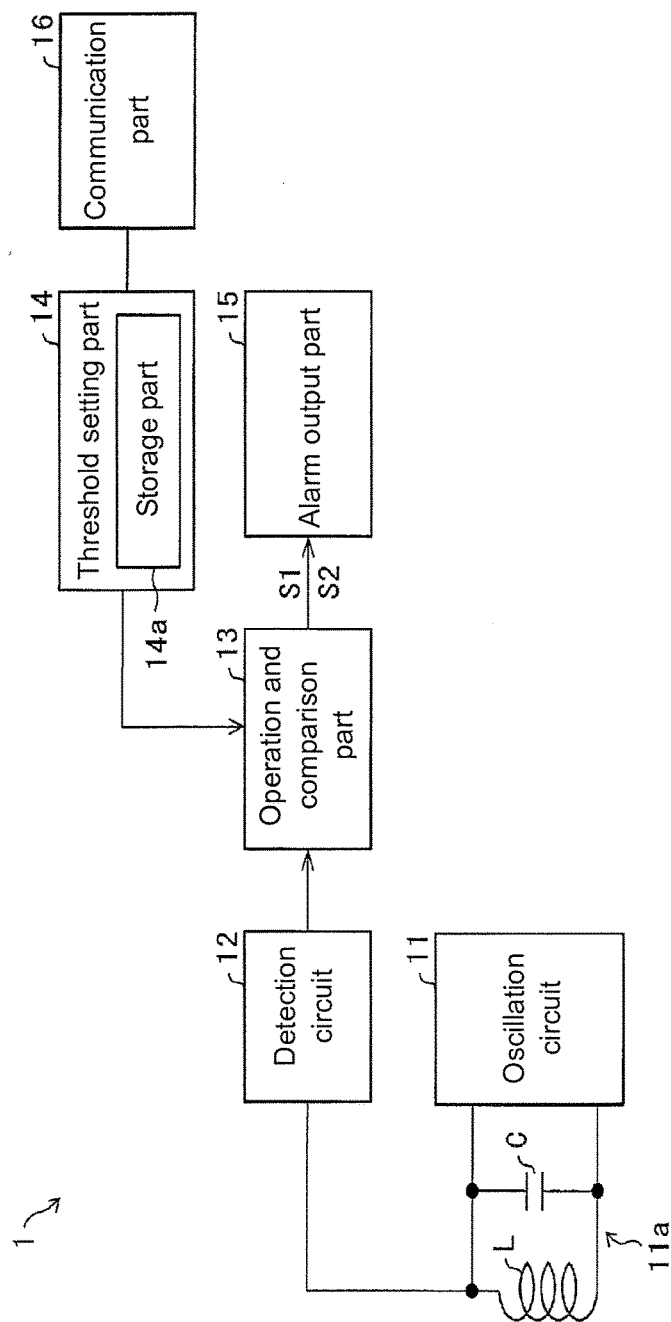
FIG. 1 shows an embodiment of a proximity switch in the present invention, and is a block diagram showing the constitution of the proximity switch having an oscillation switch, the oscillation circuit oscillates to generate a high frequency, and due to the proximity of the detected object containing metal, the amplitude of the high frequency is attenuated.
Figure 2:
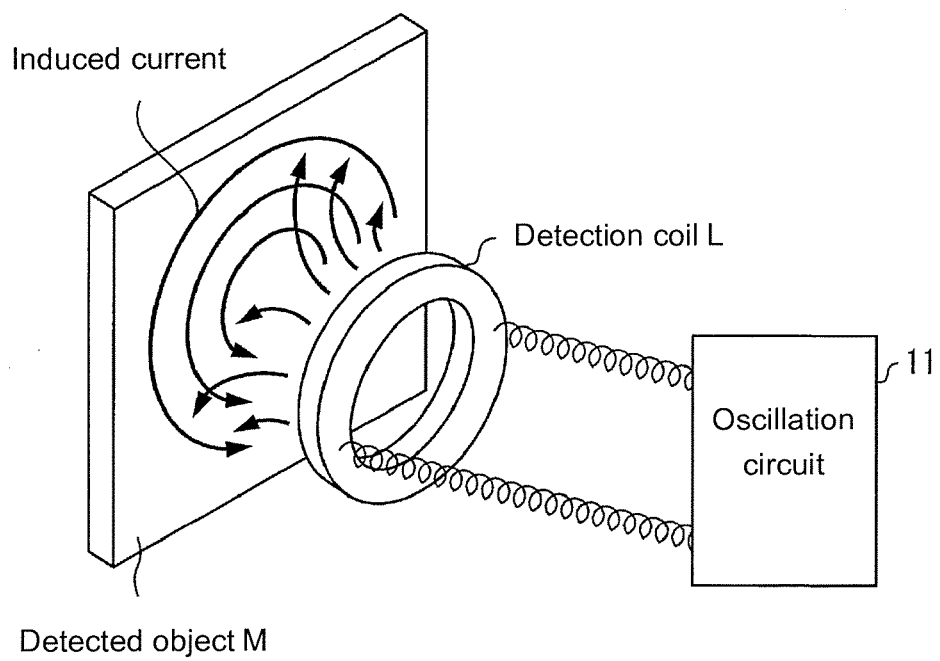
FIG. 2 is a space diagram showing an action principle of the proximity switch.

FIG. 1 explains the constitution of the induction type proximity switch as the proximity switch of this embodiment. FIG. 1 shows the induction type proximity switch 1 in this embodiment, and is a block diagram showing the constitution of the induction type proximity switch 1 having an oscillation circuit 11, the oscillation circuit 11 oscillates to generate a high frequency, and due to the proximity of the detected object containing metal, the amplitude of the high frequency is attenuated. FIG. 2 is a space diagram showing an action principle of the induction type proximity switch 1.

As shown in FIG. 1, the induction type proximity switch 1 of this embodiment comprises an oscillation circuit 11 containing a detection coil L and a resonance circuit part 11a of a capacitor C, a detection circuit 12 as a detection part, an operation and comparison part 13 as a comparison part, a threshold setting part 14, an alarm output part 15 and a communication part 16.

In the oscillation circuit 11 containing the detection coil L and the resonance circuit part 11a of the capacitor C, as shown in FIG. 2, when the detected object containing metal approaches to a high frequency magnetic field generated from the oscillation of the detection coil L, an induction current generated by an electromagnetism induction phenomenon flows in the metal, such that heat loss is generated in the metal.

Since the heat loss caused by the induction current can absorb the energy of the oscillation circuit 11, as a result, the oscillation circuit 11 cannot keep an oscillation state, and the oscillation is attenuated or stopped.

The induction type proximity switch 1, as shown in FIG. 1, is provided with a detection circuit 12 as a detection part for detecting the oscillation state, and the detection circuit 12 detects the amplitude of the high frequency generated by the oscillation of the oscillation circuit 11.

Besides, the induction type proximity switch 1 is provided with an operation and comparison part 13 as a comparison part, which compares the amplitude of the high frequency detected by the detection circuit 12 with a threshold set for the distance of excessive proximity as the distance from the oscillation circuit 11 to the detected object M. In addition, when detecting that the detected amplitude is under the threshold, the operation and comparison part 13 outputs the excessive proximity detection signal S1 as the detection signal of the specific range to the alarm output part 15.

When the alarm output part 15 inputs the excessive proximity probe signal S1, an alarm of excessive proximity is output to the outside. The alarm can be performed by using for example sound, but not limited to sound, and can be performed by using light, or both sound and light.

In addition, in the induction type proximity switch 1 of this embodiment, the distance of excessive proximity as the distance from the oscillation circuit 11 to the detected object M corresponds to the metal type and is selectively set at the threshold setting part 14.

Figure 3:
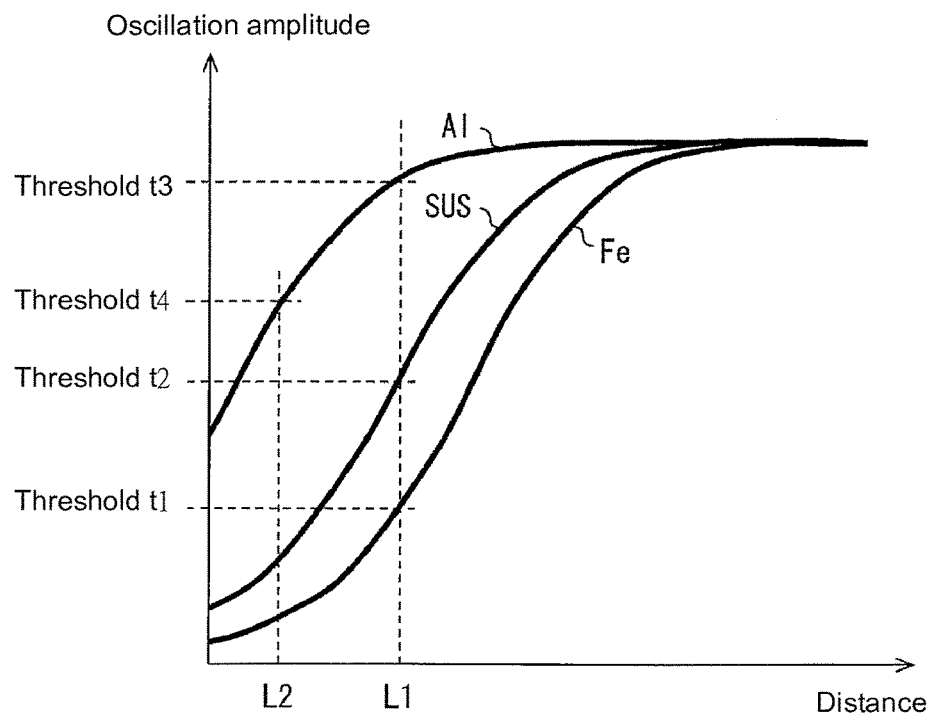
FIG. 3 is a chart showing the relation between a threshold of the oscillation amplitude in multiple metals in the proximity switch as a target and the distance to the detected object.

That is, in this embodiment, for example, the detected object M containing metal uses Fe, SUS and Al as a detected object. The relation between a detected distance of Fe, SUS and Al and the oscillation amplitude is as shown in FIG. 3. As shown in FIG. 3, corresponding to the metal type, due to the proximity of the detected object M containing metal, the amplitude of the high frequency is attenuated. At this point, since the magnet senses to generate magnetic flux, compared with the detected object M being a non-magnet, the interlinking quantity facing the magnetic flux of the detected object M is increased, and the inductance of the detected coil L changes. As a result, according to the resistivity and magnetic permeability of the detected object M, the eddy current loss caused by the detected object M is changed.

Therefore, as shown in FIG. 3, corresponding to the metal type, due to the proximity of the detected object M containing metal and the difference of the pattern of an attenuation curve of the amplitude attenuation of the high frequency, corresponding to the metal type, the threshold set for the distance of excessive proximity as the distance to the detected object M is different.

For example, when the detected object M is Fe, when the excessive proximity is detected in a distance L1, a threshold t1 must be set. In addition, when the detected object M is SUS, when the excessive proximity is detected in a distance L1, a threshold t2 must be set. Further, when the detected object M is Al, when the excessive proximity is detected in a distance L1, a threshold t3 must be set.

Hence, in this embodiment, since the threshold for detection of excessive proximity is different according to the metal type, as a judgment criterion of excessive proximity, the threshold must be set corresponding to the metal type. In this embodiment, a user setting such threshold is required to have special knowledge, therefore, errors are easily generated.

Therefore, in this embodiment, as shown in FIG. 1, a storage part 14a is arranged in the threshold setting part 14, in the storage part 14a, the threshold for the detection of excessive proximity with the distance L1 can be selectively stored as the threshold t1 when the detected object M is Fe, as t2 when the detected object M is SUS and as t3 when the when the detected object M is Al.

Besides, in this embodiment, the threshold setting part 14 is connected to a communication part 16, capable of communicating with the outside.

As a result, by designating any one of Fe, SUS or Al as the metal type from the outside, any one of the values t1, t2, and t3 corresponding to the metal type stored in the storage part 14a of the threshold setting part 14 can be selected.

Herein, in this embodiment, the communication part 16 communicates with the outside by IO-Link communication.

Such IO-Link communication is a relatively new sensing interface. A small sensor or actuator can be connected by using a cable, and information of the connected sensor can be summarized to a PLC (Programmable Logic Controller) through an IO-Link master. Besides, since the same cable can be used to supply power, wiring saving can be realized. As a result, in this embodiment, the induction type proximity switch 1 does not increase an I/O number with the IO-Link master, and the light weight and simplification of the induction type proximity switch 1 are realized.

At this point, as shown in FIG. 3, for example, when the detected object M is Al, the threshold t3 must be set when the excessive proximity is detected with the distance L1, but in each embodiment, the distance of excessive proximity can be changed in each inherent metal. For example, when the detected object M is Al, a threshold t4 is set when the excessive proximity is detected with the distance L2. The distance of the excessive proximity in each inherent metal can change the threshold according to the designation on the metal type and the distance from the outside.

Further, in this embodiment, the corresponding threshold is preset according to the designation on the metal type and the distance from the outside, and these preset thresholds are stored in the storage part 14a. Therefore, as long as the user designates the combination of the metal type and the distance from the outside through communication, the threshold corresponding to the combination of the metal type and the distance can be selected from the thresholds stored in the storage part 14a through the communication part 16. Therefore, for example, the user cannot set the threshold of excessive proximity with a distance longer than the threshold of the distance for the detected object M by mistake, therefore, an effect without error processing is realized. That is, the following complex processing is necessary for such error processing, i.e., whether the threshold of the detected distance of the object is larger than that of the excessive proximity is judged, and alarm is sent under the opposite condition.

Figure 4:
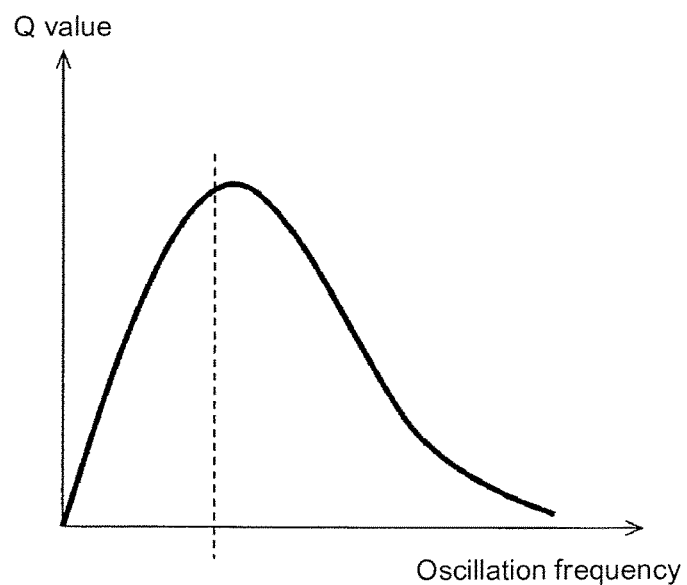
FIG. 4 is a chart showing a relation between the oscillation frequency of the high frequency generated by the oscillation of the oscillation device in the proximity switch and a Q value.

Herein, a frequency design method of the induction type proximity switch 1 is explained based on FIG. 4. FIG. 4 is a chart showing a relation between the oscillation frequency of the high frequency generated by the oscillation of the oscillation circuit 11 in the proximity switch 1 and a Q value.

The relation between the oscillation frequency of the high frequency generated by the oscillation of the oscillation circuit 11 of the induction type proximity switch 1 and the Q value in this embodiment is as shown by the curve in FIG. 4. Herein, the induction type proximity switch 1 of this embodiment has the oscillation circuit 11, which oscillates to generate a high frequency magnetic field. Due to the proximity of the detected object M containing metal, the amplitude of the high frequency magnetic field is attenuated. Therefore, if the size of the high frequency magnetic field generated by oscillation is the size of the Q value, then a low level is realized due to the proximity of the detected object M, and thus high sensitivity detection cannot be realized. Therefore, in terms of the oscillation frequency generated by the oscillation of the oscillation circuit 11, if the Q value is as high as possible, then the detection sensitivity becomes better. Therefore, in this embodiment, the frequency with raised Q value is selected. In addition, the structural design of the oscillation circuit 11 is performed according to the oscillation frequency of the selected Q value, so as to control the influence of the temperature characteristic or peripheral metal within a standard. Therefore, under the unqualified condition, the frequency of the coil L is reconsidered to be detected.

About this point, in the traditional proximity switch of the patent document 1, when multiple metals are detected, under the condition of judging with one threshold in order to detect the excessive proximity, the oscillation frequency with a low Q value is limited, but there is no such condition in this embodiment.

Next, the oscillation circuit 11 of the induction type proximity switch 1 in this embodiment adopts a soft oscillation manner that the high frequency oscillation is kept in a nonstop state when the excessive proximity of the detected object M is detected. The soft oscillation manner is explained based on FIG. 5, which is a chart showing the relation between the soft oscillation and hard oscillation in the induction type proximity switch.

Figure 5:
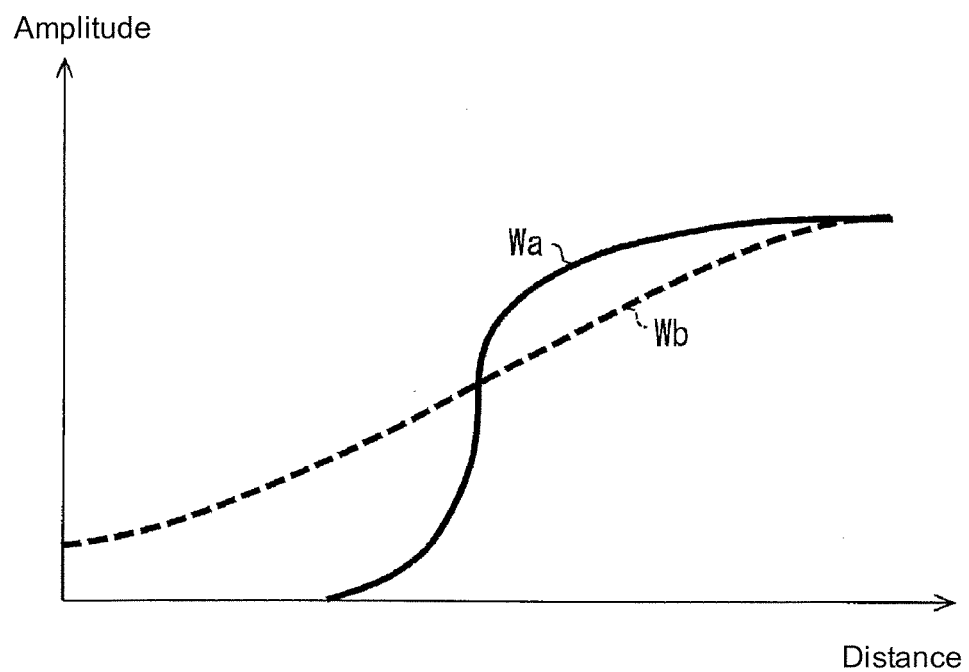
FIG. 5 is a chart showing the relation between the soft oscillation and hard oscillation in the proximity switch.

As shown in FIG. 5, till the distance to the detected object M reaches a regulated distance, the amplitude of the high frequency oscillation is sometimes in a rapidly reduced curve Wa, and this phenomenon is called as "hard oscillation". Under the condition of the high frequency oscillation represented by the curve Wa, the oscillation stops immediately, therefore, excessive proximity cannot be detected sometimes. Relatively, in FIG. 5, under the condition of the high frequency oscillation represented by a curve Wb, it is represented that the oscillation action that the amplitude is purely reduced along with the reduction of the distance to the detected object M is called as "soft oscillation". In this embodiment, since the induction type proximity switch 1 aims to detect the distance to the detected object M, the "soft oscillation" is used. In other words, the oscillation circuit 11 adopts a soft oscillation manner that the high frequency oscillation is kept in a nonstop state during the excessive oscillation of the detected object M. Therefore, the excessive proximity of the detected object M is detected.

Figure 6:
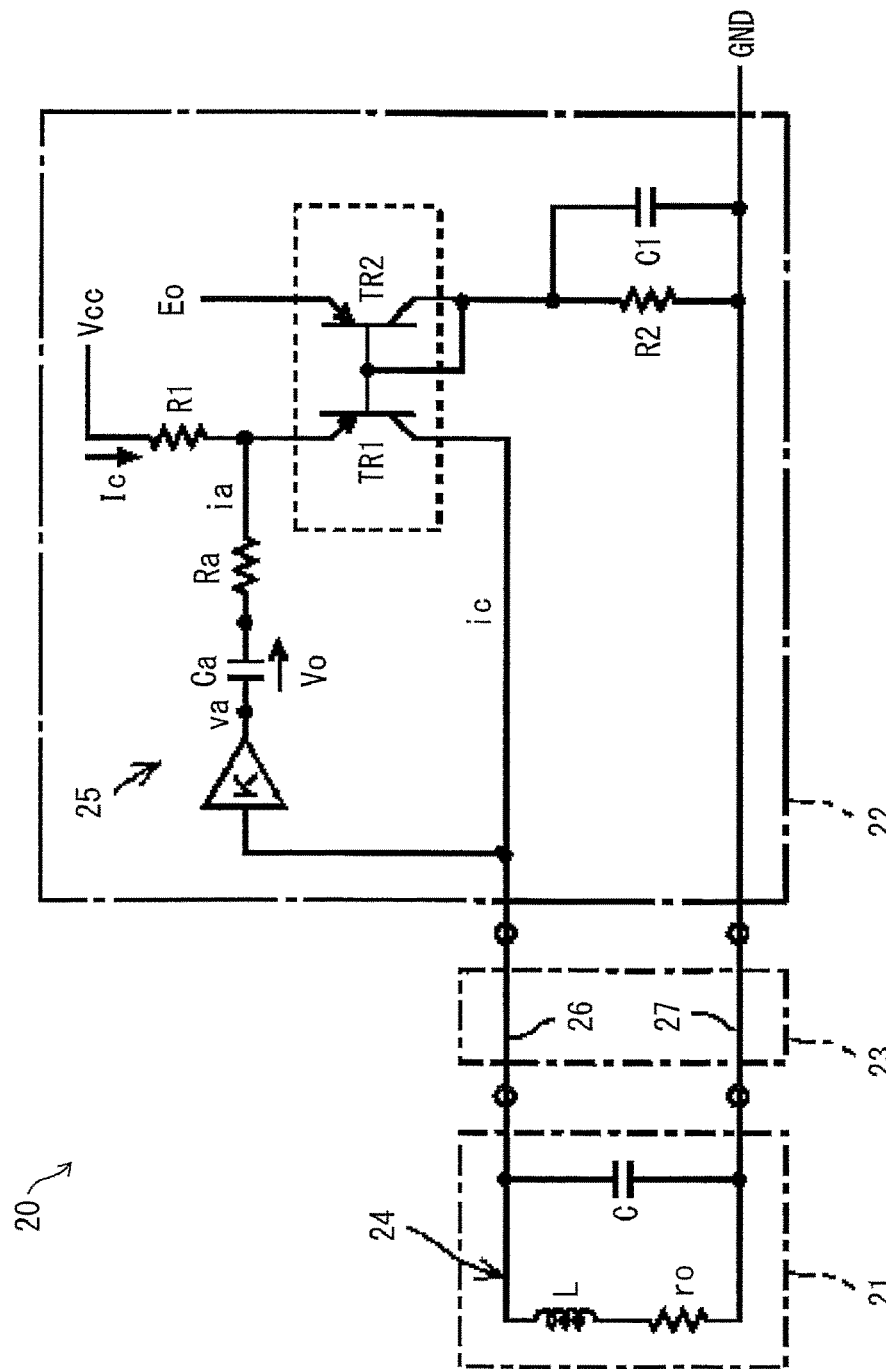
FIG. 6 shows a circuit diagram of one example of the proximity switch with the oscillation circuit having soft oscillation.

Herein, a circuit of the induction type proximity switch 1 of soft oscillation is explained based on FIG. 6. FIG. 6 shows a circuit diagram of one example of the induction type proximity switch with the oscillation circuit 25 having soft oscillation.

As shown in FIG. 6, the induction type proximity switch 20 is an amplifier-separated proximity switch of which the sensor head 21 and the amplifier part 22 are separated. The sensor head 21 contains a resonance circuit 24 between a detection coil L and a capacitor C, and the amplifier part 22 contains an oscillation circuit 25. The sensor head 21 and the amplifier part 22 are connected by a coaxial cable 23 containing two connecting wires 26 and 27. In addition, the connecting wire 27 forms a ground line.

The oscillation circuit 25 adjusts by the value of the resistor Ra applying a resonance current to the emitter of the transistor TR1 and the value of the resistor R1 connected to the emitter of the transistor TR1, thereby realizing an oscillation action of "soft oscillation", and a resonance voltage which is in simulation change and in direct proportion with the distance between the detected object M and the sensor head 21 is obtained.

In this way, the induction type proximity switch 1 of this embodiment detects whether the detected object M exists in a specific range by the proximity of the detected object M containing metal, and is provided with a detection part, for detecting a physical quantity which is changed according to the distance to the detected object M; a comparison part, for comparing the detected physical quantity and a threshold set for the corresponding physical quantity as a boundary of the specific range, and outputting a detection signal of the specific range when the detected object M exists in the specific range; and a threshold setting part, for selecting the threshold corresponding to the designated metal type according to the designation on the metal type from the outside. In addition, the outside refers to the outside of the proximity switch.

According to the constitution, the induction type proximity switch 1 detects whether the detected object M is in the specific range by the proximity of the detected object M containing metal.

In such induction type proximity switch 1, when whether the detected object is in the specific range is detected, under the condition that the detected object M, as a target, containing multiple metals, corresponding to the metal type, the output physical quantities are different. Therefore, usually, for many metals, the excessive proximity is judged with the same physical quantity, therefore, the detection range with high sensitivity cannon not be selected specific to such metal type.

Relatively, in the present invention, the threshold setting part capable of selecting the threshold corresponding to the metal type is arranged. In addition, regarding the threshold corresponding to the metal type, the threshold corresponding to the metal type can be selected as long as the metal type can be designated from the outside.

Therefore, under the condition of detecting whether the detected object is in the specific range, the physical quantity is detected by using the detection part. Further, the comparison part compares the detected physical quantity with the threshold set for the corresponding physical quantity as a boundary of the specific range, and when the detected object M exists in the specific range, the detection signal of the specific range is output. Herein, the threshold is a threshold provided from the threshold setting part and a threshold for excessive proximity corresponding to the metal type.

As a result, in the present invention, since the threshold corresponding to each metal type is used, the threshold may not be the same physical quantity relative to multiple metals. Therefore, specific to multiple metals, the threshold can be set in the detection range with high sensitivity in each metal to detect the excessive proximity, etc.

Therefore, there is provided an induction type proximity switch 1, which can detect whether the detected object M is in the specific range in the detection range with high sensitivity for the detected object M, as a target, containing multiple metals.

Besides, the induction type proximity switch 1 as the proximity switch of the present invention has oscillation circuits 11 and 25, which detect whether the detected object M exists in the specific range, the oscillation circuits 11 and 25 oscillate to generate a high frequency, due to the proximity of the detected object M containing metal, the amplitude of the high frequency as the physical quantity is attenuated. The proximity switch is provided with a detection circuit 12 as the detection part, which detects the amplitude of the high frequency generated by the oscillation circuits 11 and 25; an operation and comparison part 13 as a comparison part, for comparing the detected amplitude of the high frequency with the thresholds t1, t2 and t3 set for the corresponding amplitude or oscillation frequency as a boundary of the specific range, and outputting a detection signal of the specific range when the detected object M exists in the specific range; and a threshold setting part for selecting the thresholds t1, t2 and t3 corresponding to the designated metal type according to the designation on the metal type from the outside.

According to the constitution, the induction type proximity switch 1 has the oscillation circuits 11 and 25, which detect whether the detected object M exists in the specific range, the oscillation circuits 11 and 25 oscillate to generate a high frequency, due to the proximity of the detected object M containing metal, the amplitude of the high frequency as the physical quantity is attenuated.

Besides, in this embodiment, the threshold setting part 14 capable of selecting the thresholds t1, t2 and t3 corresponding to the metal type is arranged. In addition, regarding the thresholds t1, t2 and t3 corresponding to the metal type, the thresholds t1, t2 and t3 corresponding to the metal type can be selected as long as the metal type can be designated from the outside.

Therefore, under the condition of detecting whether the detected object M exists in the specific range, the amplitude of the high frequency generated by the oscillation of the oscillation circuits 11 and 25 is detected by the detection circuit 12. Further, the operation and comparison part 13 compares the detected amplitude of the high frequency with the thresholds t1, t2 and t3 set for expressing that the distance to the detected object M exists in the boundary of the specific range, and the detection signal of the specific range is output when the detected amplitude is in the specific range. Herein, the threshold is thresholds t1, t2 and t3 provided from the threshold setting part 14 and corresponding to the metal type.

As a result, in this embodiment, since the thresholds t1, t2 and t3 corresponding to each metal type are used, the thresholds t1, t2 and t3 may not be the same amplitude relative to multiple metals. Therefore, specific to multiple metals, the thresholds t1, t2 and t3 can be set in the detection range with high sensitivity in each metal to detect the excessive proximity.

Therefore, there is provided an induction type proximity switch 1, which can detect whether the detected object M is in the specific range in the detection range with high sensitivity for the detected object M, as a target, containing multiple metals.

In addition, under the condition of the difference caused by different materials of the detected object, if an operating part for setting the thresholds t1, t2 and t3 are arranged in the induction type proximity switch 1, then the structure of the induction type proximity switch 1 is complicated, and it is hard to keep the waterproofness or oil resistance due to the complicating.

Relatively, in this embodiment, when the thresholds t1, t2 and t3 in the threshold setting part 14 and corresponding to the metal type are selected, the metal type can be designated from the outside through communication.

As a result, there is no need to arrange a threshold input part in the threshold setting part 14 of the induction type proximity switch 1, therefore, the structure of the induction type proximity switch 1 is simplified, and the waterproofness or oil resistance is improved.

In addition, in the induction type proximity switch 1 of this embodiment, the specific range is the range that the distance to the detected object M reaches the range of excessive proximity, and the operation and comparison part 13 compares the detected amplitude of the high frequency with the thresholds t1, t2 and t3 for excessive proximity set for expressing that the distance to the detected object M exists in the boundary of the specific range, and the detection signal S1 for excessive proximity as the detection signal of the specific range is output when the detected amplitude is under the thresholds t1, t2 and t3 for excessive proximity.

Therefore, the induction type proximity switch 1 detects whether the distance to the detected object M reaches the range of excessive proximity.

At this point, the detection circuit 12 detects the amplitude of the high frequency generated by the oscillation of the oscillation circuits 11 and 25. Further, the operation and comparison part 13 compares the detected amplitude of the high frequency with the thresholds t1, t2 and t3 set for the corresponding amplitude as a boundary of the excessive proximity, i.e., the thresholds t1, t2 and t3 for excessive proximity, and the detection signal S1 of excessive proximity is output when the detected amplitude is under the threshold for excessive proximity. Herein, the threshold is the thresholds t1, t2 and t3 for excessive proximity provided from the threshold setting part 14 and corresponding to the metal type.

As a result, in this embodiment, since the thresholds t1, t2 and t3 for excessive proximity corresponding to each metal type are used, the thresholds t1, t2 and t3 for excessive proximity may not be the same amplitude or oscillation frequency relative to multiple metals. Therefore, specific to multiple metals, the thresholds t1, t2 and t3 for excessive proximity can be set in the detection range with high sensitivity in each metal to respectively detect the excessive proximity.

Therefore, there is provided an induction type proximity switch 1, which can detect excessive proximity in the detection range with high detection sensitivity for the detected object M, as a target, containing multiple metals.

Besides, in the induction type proximity switch 1, the thresholds t1, t2, t3 and t4 in the threshold setting part 14 can be changed by the distances L1 and L2 corresponding to the metal type and preset as excessive proximity, and according to the distances L1 and L2 from the outside, corresponding to the metal type and preset as excessive proximity, the corresponding thresholds t1, t2, t3 and t4 for excessive proximity or instability detection are set.

Therefore, the thresholds t1, t2, t3 and t4 for excessive proximity can be changed by the distances L1 and L2 corresponding to the metal type and preset as the excessive proximity when the excessive proximity is judged. As a result, the induction type proximity switch 1 with high convenience can be provided.

Besides, the induction type proximity switch 1 of the present invention has a storage part 14a, which stores multiple combinations of the distances L1 and L2 corresponding to the metal type and preset as excessive proximity, and the thresholds t1, t2, t3 and t4 corresponding to each combination and for excessive proximity, and according to the designation of the combination of the distances L1 and L2 from the outside, corresponding to the metal type and preset as excessive proximity, any one of the corresponding thresholds t1, t2, t3 and t4 for excessive proximity is selected.

Therefore, any one of the thresholds t1, t2, t3 and t4 can be automatically selected by designating combination of the metal type and the distances L1 and L2 from the outside through communication when the thresholds t1, t2, t3 and t4 for excessive proximity are changed by the multiple combinations of the distances L1 and L2 corresponding to the metal type and preset as excessive proximity when the excessive proximity is judged.

As a result, a user cannot set the threshold for excessive proximity with a distance longer than the distance detected by the object by mistake, such that error processing is not required.

Besides, in the induction type proximity switch 1 of the present invention, the threshold setting part 14 is connected to a communication part 16 for communication with the outside by using IO-Link communication.

Therefore, the communication part 16 communicates with the outside by using IO-Link communication. As a result, the light weight of the induction type proximity switch 1 can be realized and the IO-Link communication can also realize power supply.

In addition, in the induction type proximity switch 1 of the present invention, the oscillation circuits 11 and 20 adopt a soft oscillation manner that the amplitude of the high frequency during the excessive proximity of the detected object M is kept in the nonstop state.

Therefore, the condition that the high frequency oscillation in a stop state cannot be detected in the position of the distance of excessive proximity is prevented.

Besides, the induction type proximity switch 1 of the present invention is provided with an alarm output part 15, alarming when the operation and comparison part 13 outputs the detection signal S1 of excessive proximity.

Therefore, by using the alarm output part 15, the excessive proximity is alarmed to the outside, such that the user can easily distinguish the condition that the detected object M is in excessive proximity.

Embodiment 2

Figure 7:
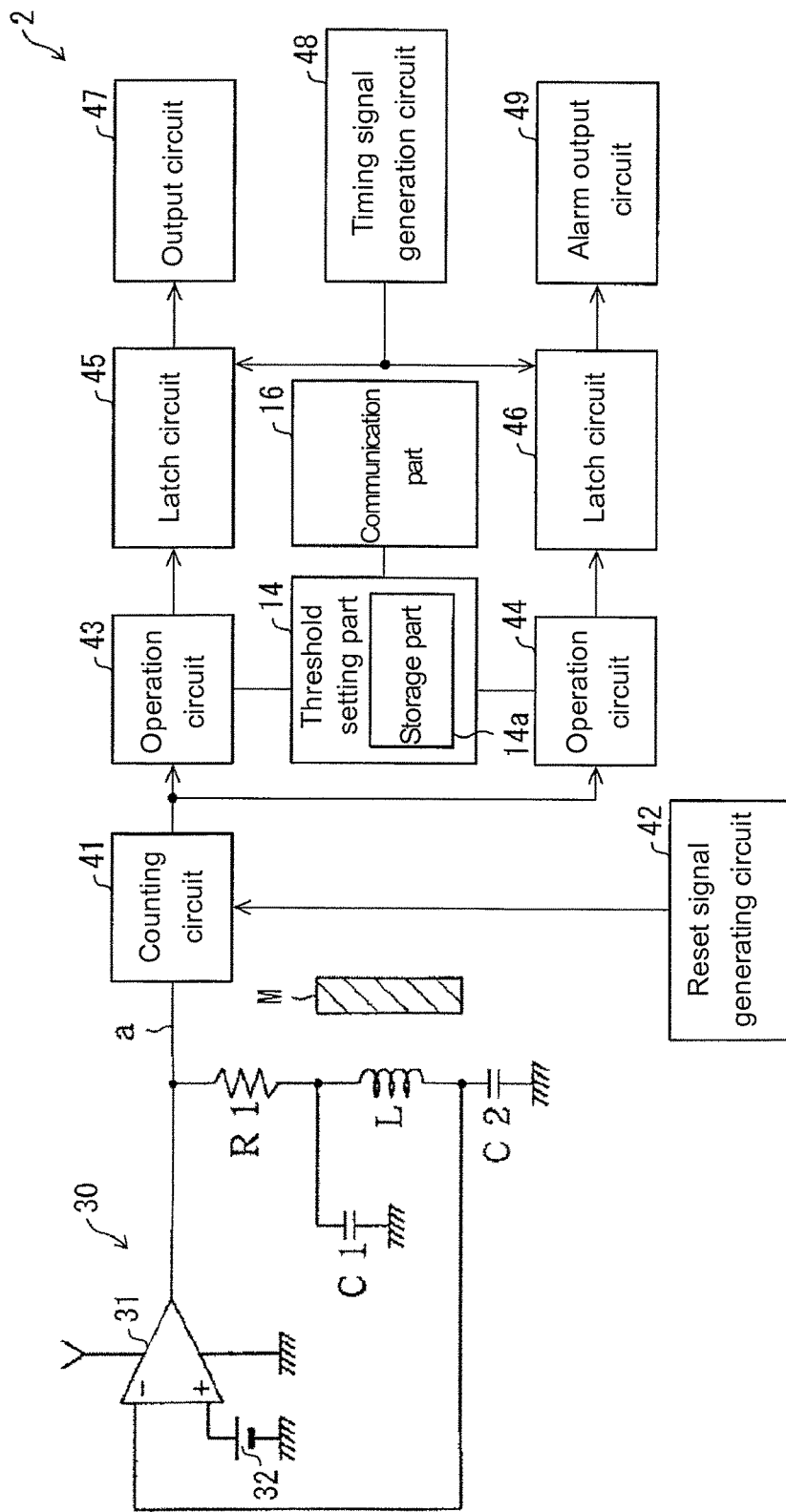
FIG. 7 shows another embodiment of the proximity switch in the present invention, and is a block diagram showing the constitution of the proximity switch having an oscillation switch, the oscillation circuit oscillates to generate a high frequency, and due to the proximity of the detected object containing metal, the oscillation frequency of the high frequency is increased.
Figure 8:
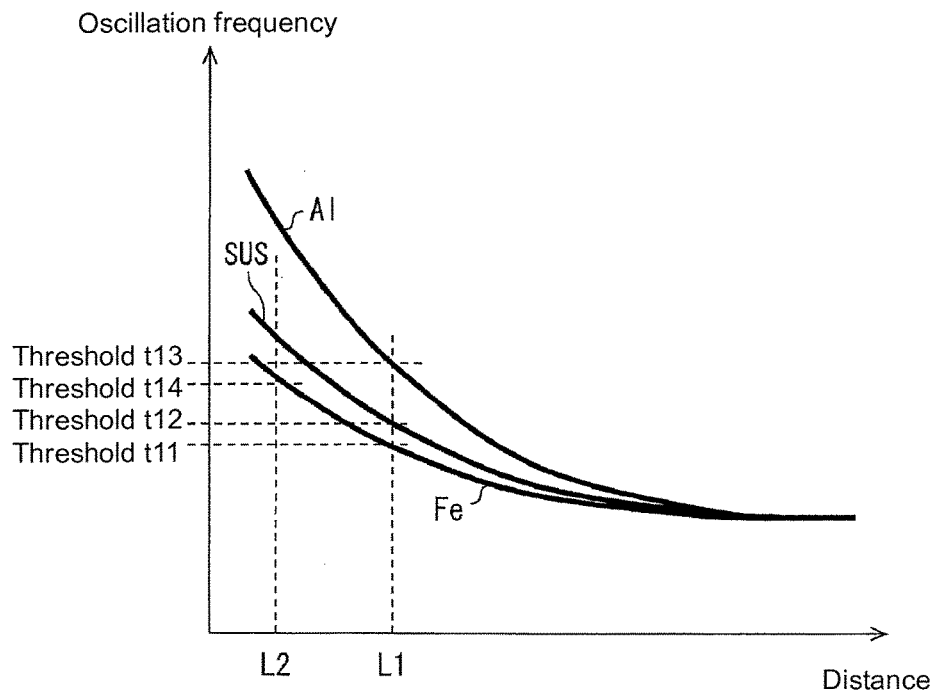
FIG. 8 is a chart showing the relation between a threshold of the oscillation amplitude in multiple metals in the proximity switch as a target and the distance to the detected object.

Another embodiment of the present invention is explained based on FIGS. 7-8. In addition, the constitution except for that explained in embodiment 2 is same as that in embodiment 1. Besides, for facilitating explanation, the components with the functions same as those of the components shown by the drawings of embodiment 1 are marked with the same numbers and the description is omitted.

In the induction type proximity switch 1 of the embodiment 1, the induction type proximity switch as the proximity switch is described, the induction type proximity switch has an oscillation circuit 11, which detects the excessive proximity of the detected object M, and the oscillation circuit 11 oscillates to generate a high frequency, and due to the proximity of the detected object M containing metal, the amplitude of the high frequency is attenuated.

Relatively, the induction type proximity switch 2 of this embodiment differs in having an oscillation circuit 30, which detects the excessive proximity of the detected object M, and the oscillation circuit 30 oscillates to generate a high frequency, and due to the proximity of the detected object M containing metal, the oscillation frequency of the high frequency is increased.

The constitution of the induction type proximity switch 2 as the proximity switch of the embodiment 2 is described based on FIG. 7. FIG. 7 shows another embodiment of the proximity switch 2 in the present invention, and is a block diagram showing the constitution of the induction type proximity switch 2 having an oscillation switch 30, the oscillation circuit 30 oscillates to generate a high frequency, and due to the proximity of the detected object M containing metal, the oscillation frequency of the high frequency is increased. In addition, in FIG. 7, the threshold setting part 14 of the induction type proximity switch 1 existing in embodiment 1 is omitted.

As shown in FIG. 7, the induction type proximity switch 2 of this embodiment can adopt the oscillation circuit as mentioned below, the oscillation circuit 30 oscillates in a fixed frequency, by properly arranging the values of capacitors C1 and C2 of the resistor R1, the oscillation frequency is changed corresponding to the distance to the detected object M. That is, the following phenomenon is a detection principle, i.e., the closer the distance to the detected object M is, the larger the oscillation frequency is.

The induction type proximity switch 2 of this embodiment uses the oscillation circuit 30 to judge whether the detected object M approaches or not, and detects the state of the excessive proximity of the detected object M according to the change of the oscillation frequency.

Specifically speaking, as shown in FIG. 7, the induction type proximity switch 2 of this embodiment comprises an oscillation circuit 30 having a comparator 31. In the oscillation circuit 30, the output side of the comparator 31 is connected to a serial circuit of the resistor R1 and the capacitor C1, and the capacitor C1 is connected to an oscillation coil L and the capacitor C2 in parallel.

In the induction type proximity switch 2 of this embodiment, regarding the increasing of the oscillation frequency begun from the non-proximity state of the detected object M, the existence of the detected object M is detected by a counting circuit 41, an operation circuit 43 and a latch circuit 45, and when the detected object M exists, information is output by an output circuit 47. On another aspect, regarding the increasing of the oscillation frequency begun from the non-proximity state of the detected object M, the excessive proximity of the detected object M is detected by a counting circuit 41, an operation circuit 43 and a latch circuit 46, and when the excessive proximity is detected, an alarm signal is output to the outside through an alarm output circuit 49.

Specifically speaking, the output of the oscillation circuit 30 is given to the counting circuit 41. The counting circuit 41 counts the input pulse during the period till the reset signal from the reset signal generating circuit 42, and the counting output is given to operation circuits 43 and 44. The operation circuit 43 judges whether the detected object M approaches above the regulated distance based on the ratio of the normal oscillation frequency to that during proximity of the detected object M. The operation circuit 43 for example, contains a digital comparator, and when the pulse of the regulated distance for example 5 is counted, a detection signal is output to the latch circuit 45.

On the other aspect, the operation circuit 44 detects whether the excessive proximity of the detected object 44 is over the threshold based on the ratio of the normal oscillation frequency to that during excessive proximity of the detected object M. The operation circuit 44 also comprises a digital comparator, which outputs when a pulse number for example more than 8 is counted. The output of the operation circuit 44 is given to the latch circuit 46. For latch circuits 45 and 46, a timing signal is given from a timing signal generation circuit 48, the signal is kept at every such moment, and the latch circuit 45 outputs to the outside from the output circuit 47 in a form of object detection signal.

Besides, the output of the latch circuit 46 is output to the outside from the alarm output circuit 49 in a form of a detection signal S1 of excessive proximity. The alarm output circuit 49 is an alarming part alarming excessive proximity to the outside, the detection signal S1 of the excessive proximity can be output by a cable, or the user can be informed with the excessive proximity by a display circuit of the induction type proximity switch 2. Herein, the counting circuit 41, the reset signal generating circuit 42, the operation circuit 44 and the latch circuit 46 constitute an excessive proximity detection part for detecting excessive proximity of the object according to the generated frequency change.

Herein, in the induction type proximity switch 2 of this embodiment, the threshold set for expressing the distance from the distance between the oscillation circuit 30 to the detected object M to the distance of excessive proximity is selectively arranged in the threshold setting part 14 by corresponding to the metal type.

That is, in this embodiment, the detected object M containing metal may be for example, a detected object of Fe, SUS and Al, and a relation between the detected distance of Fe, SUS and Al and the oscillation amplitude is as shown in FIG. 8. As shown in FIG. 8, corresponding to the metal type, the oscillation frequency is increased due to the proximity of the detected object M containing metal. Specifically speaking, if a magnet metal approaches, the oscillation frequency is increased due to the increase of the resistor R1, and if a non magnet metal approaches, the oscillation frequency is increased due to the increase of the detection coil L.

Therefore, as shown in FIG. 8, corresponding to the metal type, the pattern of the curve of the increased oscillation frequency due to the proximity of the detected object M containing metal is different. Therefore, corresponding to the metal type, the threshold from the distance to the detected object M to the distance up to excessive proximity is different.

For example, when the detected object M is Fe, when the excessive proximity is detected in a distance L1, a threshold t11 must be set. In addition, when the detected object M is SUS, when the excessive proximity is detected in a distance L1, a threshold t12 must be set. Further, when the detected object M is Al, when the excessive proximity is detected in a distance L1, a threshold t13 must be set.

In this way, in this embodiment, the threshold for detection of excessive proximity is different according to metal type, therefore, the threshold must be set corresponding to the metal type. In this embodiment, a user setting such threshold is required to have special knowledge, therefore, it is not preferable.

Therefore, in this embodiment, as shown in FIG. 7, a storage part 14a is arranged in the threshold setting part 14, in the storage part 14a, the threshold for the detection of excessive proximity with the distance L1 can be selectively stored as the threshold t11 when the detected object M is Fe, as t12 when the detected object M is SUS and as t13 when the detected object M is Al.

Besides, in this embodiment, the threshold setting part 14 is connected to a communication part 16, capable of communicating with the outside.

Besides, by designating any one of Fe, SUS or Al as the metal type from the outside, any one of the thresholds t11, t12 and t13 corresponding to the metal type stored in the storage part 14a of the threshold setting part 14 can be selected.

Herein, as shown in FIG. 8, For example, when the detected object M is Fe, when the excessive proximity is detected in a distance L1, a threshold t11 must be set. But in this embodiment, the distance of excessive proximity can be changed in each inherent metal. For example, when the detected object M is Fe, and when the detection for excessive proximity is performed with the distance L2, the threshold t14 is set. The distance of excessive proximity in each inherent metal can be set to change the threshold according to the designation on the metal variety and the distance from the outside.

In addition, other constitutions except for the description in FIG. 4 is same as the induction type proximity switch 1 in embodiment 1, and is thus omitted.

Thus, the induction type proximity switch 2 of this embodiment has an oscillation circuit 30, which detects the excessive proximity of the detected object M, the oscillation circuit 30 generates a high frequency, due to the proximity of the detected object M containing metal, such that the oscillation frequency of the high frequency is increased. Besides, the induction type proximity switch 2 has: a counting circuit 41 as a detection part, for detecting the oscillation frequency of the high frequency generated by the oscillation circuit 30; an operation circuit 44 and a latch circuit 46 as the comparison part, for comparing the detected oscillation frequency of the high frequency with the threshold set for the distance from the distance to the detected object M to the distance of excessive proximity, and outputting a detection signal S1 of the excessive proximity when the detected oscillation frequency is over the thresholds t11, t12 and t13 for excessive proximity; and a threshold setting part 14, capable of selecting the threshold corresponding to the metal type according to the designation on the metal type from the outside.

According to the constitution, the induction type proximity switch 2 has an oscillation circuit 30, which detects the excessive proximity of the detected object M, the oscillation circuit 30 generates a high frequency, due to the proximity of the detected object M containing metal, the oscillation frequency of the high frequency is increased.

In the induction type proximity switch 2, under the condition of the detected object M, as a target, containing multiple metals, corresponding to the metal type, the increased degree of the oscillation frequency of the high frequency generated by oscillation is different. Therefore, usually, for many metals, the excessive proximity is judged with the same oscillation frequency, therefore, the detection range with high sensitivity specific to each metal sometimes cannot be targeted, as a result, the excessive proximity is judged in the detection range with low sensitivity.

Relatively, in this embodiment, the threshold setting part 14 capable of selecting the thresholds t11, t12 and t13 corresponding to the metal type is arranged. In addition, regarding the thresholds t11, t12 and t13 for excessive proximity corresponding to the metal type, the thresholds t11, t12 and t13 for excessive proximity corresponding to the metal type can be selected as long as the metal type can be designated from the outside.

Therefore, under the condition of detecting whether the detected object M is excessive proximity, the counting circuit 41 is used to detect the oscillation frequency of the high frequency generated by the oscillation circuit 30. Further, the operation circuit 44 and the latch circuit 46 compare the detected oscillation frequency of the high frequency with the thresholds t11, t12 and t13 for excessive proximity that expressing the distance to the detected object M to the distance for excessive proximity, and when the detected oscillation frequency is over the threshold, the detection signal S1 of excessive proximity is output. Herein, the thresholds t11, t12 and t13 for excessive proximity are the thresholds t11, t12 and t13 for excessive proximity and corresponding to the metal type provided from the threshold setting part 14.

As a result, in this embodiment, since the thresholds t11, t12 and t13 corresponding to each metal variety is used, the excessive proximity can be detected in the detection range with high detection sensitivity.

Therefore, there is provided an induction type proximity switch 2, which can detect the excessive proximity in the detection range with high detection sensitivity for the detected object M, as a target, containing multiple metals.

In addition, under the condition of the difference caused by different materials of the detected object M, if an operating part for setting the thresholds t11, t12 and t13 are arranged in the induction type proximity switch 2, then the structure of the proximity switch is complicated, and it is hard to keep the waterproofness or oil resistance due to the complicating.

Relatively, in this embodiment, when the thresholds t11, t12 and t13 for excessive proximity in the threshold setting part 14 and corresponding to the metal type are selected, the metal type can be designated from the outside through communication.

As a result, there is no need to arrange a threshold input part in the threshold setting part 14 of the induction type proximity switch 2, therefore, the structure of the induction type proximity switch 2 is simplified, and the waterproofness or oil resistance is improved.

In addition, in the description, the induction type proximity switch 2 has an oscillation circuit 30, the condition of detecting the excessive proximity of the detected object M is explained, the oscillation circuit 30 oscillates to generate a high frequency, and due to the proximity of the detected object M containing metal, the oscillation frequency of the high frequency is increased.

Relatively, the applicable range of the present invention may not be limited to such induction type proximity switch 2. That is, as the induction type proximity switch, for example, there is also an induction type proximity switch having the following type of oscillation circuit and detecting the excessive proximity of the detected object M, the oscillation circuit oscillates to generate a high frequency, and due to the proximity of the detected object M containing metal, the oscillation frequency of the high frequency is reduced. In the present invention, in such type of the induction type proximity switch, the excessive proximity can also be detected with the same thought. But, under such condition, the difference is that the alarm of excessive proximity is sent when the detected oscillation frequency is under the threshold for excessive proximity.

Embodiment 3

Figure 9:
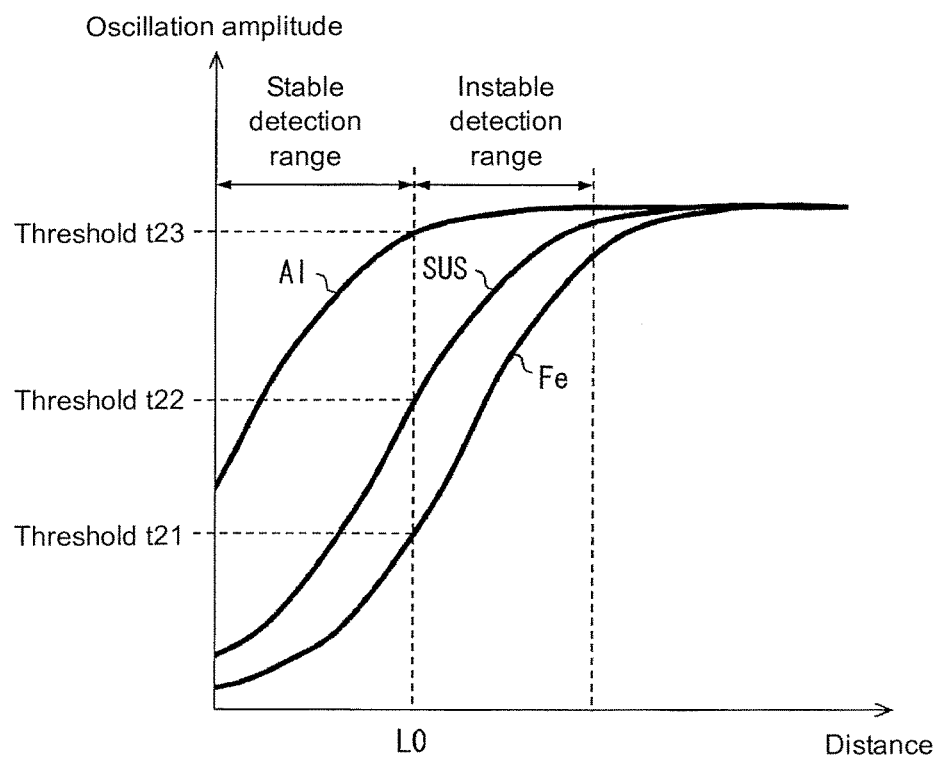
FIG. 9 shows a further embodiment of the proximity switch of the present invention, is a chart showing that an instable detection range and a stable detection range exist in the detected distance to the detected object in an induction type proximity switch adopting the oscillation circuit, the oscillation switch oscillates to generate a high frequency, and due to the proximity of the detected object containing metal, the amplitude of the high frequency is attenuated.

Another embodiment of the present invention is explained based on FIG. 9. In addition, the constitution except for that explained in embodiment 3 is same as that in embodiment 1 and embodiment 2. Besides, for facilitating explanation, the components with the functions same as those of the components shown by the drawings of embodiment 1 and embodiment 2 are marked with the same numbers, and the description is omitted.

In the induction type proximity switch 1 in embodiment 1 and the induction type proximity switch 2 in embodiment 2, the induction type proximity switch as the proximity switch is explained, and the induction type proximity switch detects the excessive proximity of the detected object M.

Relatively, the induction type proximity switch in embodiment 3 differs in detecting whether the detected object M is in an instable detection range.

The induction type proximity switch as the proximity switch of embodiment 3 is explained based on FIG. 9. FIG. 9 shows a further embodiment of the induction type proximity switch of the present invention, is a chart showing that an instable detection range and a stable detection range exist in the detected distance to the detected object M in an induction type proximity switch 1 adopting the oscillation circuit, the oscillation switch oscillates to generate a high frequency, and due to the proximity of the detected object M containing metal, the amplitude of the high frequency is attenuated.

In terms of the proximity switch, besides the detection that whether the detected object M is in excessive proximity, if the distance to the detected object M is in an instable detection range in the detection distance, then there is no reliability in detection. Therefore, whether the distance to the detected object M in the detected distance is in the stable detection range, on the other hand, whether the distance to the detected object M is detected in an instable detection range is also important.

Besides, in the detection that whether the distance whether the distance to the detected object M is in the stable detection range, if the metal type is different, then it is indicated that distances of the boundaries of the stable detection range and the instable detection range are also different.

For example, as shown in FIG. 9, under the condition of Fe, the boundary of the stable detection range and the instable detection range, i.e., the distance L0 to the detected object M becomes the oscillation amplitude shown by a threshold t21 for instability detection. Besides, under the condition of SUS, the boundary of the stable detection range and the instable detection range, i.e., the distance L0 to the detected object M becomes the oscillation amplitude shown by a threshold t22 for instability detection. Further, under the condition of Al, the boundary of the stable detection range and the instable detection range, i.e., the distance L0 to the detected object M becomes the oscillation amplitude shown by a threshold t23 for instability detection. Therefore, under the condition that the detected object M contains multiple meals, in the conventional technology, the problem is that the high detection sensitivity cannot be kept.

Relatively, in the induction type proximity switch of the present invention, the operation and comparison part 13 as the comparison part compares the detected amplitude or oscillation frequency of the high frequency with the thresholds set for the corresponding amplitude or oscillation frequency as a boundary of the instability detection in the detected distance, i.e., the thresholds t21, t22 and t23 for instability detection, and outputs a signal S2 in the instable detection range as the detection signal of the specific range when the detected amplitude is over the threshold for instability detection.

Therefore, the proximity switch detects whether distance to the detected object in the detected distance is in the range of the instable detection range.

As this point, the detection circuit 12 as the detection part detects the amplitude of the high frequency generated by the oscillation of the oscillation circuit 11. Further, the operation and comparison part 13 compares the detected amplitude or oscillation frequency of the high frequency with the thresholds set for the corresponding amplitude or oscillation frequency as a boundary of the instability detection range in the detected distance, i.e., the thresholds t21, t22 and t23 for instability detection, and outputs a signal S2 in the instable detection range as the detection signal of the specific range when the detected amplitude is over the threshold for instability detection. Herein, the threshold is the thresholds t21, t22 and t23 for instability detection, corresponding to the metal type and provided from the threshold setting part 14.

As a result, in this embodiment, since the thresholds t21, t22 and t23 for instability detection corresponding to each metal type are used, therefore the thresholds t21, t22 and t23 for instability detection may not be the same amplitude or oscillation frequency relative to the multiple metals. Therefore, specific to multiple metals, the thresholds t21, t22 and t23 for instability detection can be respectively set in the detection range with high detection sensitivity in each metal to detect the instable detection range.

Therefore, there is provided a proximity switch, which can detect the instable detection range in the detection range with high detection sensitivity for the detected object M, as a target, containing multiple metals.

Besides, in the induction type proximity switch of this embodiment, the thresholds t21, t22 and t23 for instability detection in the threshold setting part 14 can be changed corresponding to the metal type and the distance preset as the instable detection range, and according to the designation from the outside, corresponding to the metal type and preset as the instable detection range, the corresponding thresholds for instability detection are set.

Therefore, the thresholds t21, t22 and 23 for instability detection can be changed by the distance corresponding to the metal type and preset as the instable detection range when the instable detection range is judged. As a result, the induction type proximity switch 1 with high convenience is provided.

Besides, the induction type proximity switch of this embodiment has a storage part 14a, which stores multiple combinations of the distance corresponding to the metal type and preset as the instable detection range, and the threshold corresponding to each combination and used for instability detection, and according to the designation of the combination of the distance from the outside, corresponding to the metal type and preset as the instable detection range, the corresponding thresholds t21, t22 and t23 for instability detection are selected.

Therefore, the thresholds t21, t22 and t23 for instability detection can be automatically selected by designating the combination of the metal type and the distance preset as the instable detection range from the outside through communication when the thresholds t21, t22 and t23 for instability detection are changed by the combination of the distance corresponding to the metal type and preset as the instable detection range when the instable detection range is judged.

As a result, a user cannot set the threshold for instability detection with a distance longer than the distance detected by the object by mistake, such that error processing is not required.

Besides, the induction type proximity switch of the present embodiment is provided with an alarm output part 15, which outputs an alarm when the operation and comparison part 13 outputs a signal S2 in the instable range.

Therefore, by using the alarm output part 15, the signal S2 in the instable range is alarmed to the outside, such that the user can easily distinguish the condition that the detected object M is in the instable range.

In addition, in this embodiment, the alarm part for example comprises a lamp lighting part, which lights a yellow lamp when the detected object M is in the instable range. On the other hand, a blue lamp is lighted when the M is in the stable range. Therefore, the user is informed by using the lamp with color.

In addition, in the description, the induction type proximity switch in this embodiment is described by the induction type proximity switch 1 suitable for above description. However, the induction type proximity switch in this embodiment is not necessarily limited to the induction type proximity switch 1 in embodiment 1, and can be suitable for the induction type proximity switch 2 in embodiment 2, the induction type proximity switch 1 has an oscillation circuit 11 of which the amplitude is attenuated due to the proximity of the detected object containing metal, and the induction type proximity switch 2 has an oscillation circuit 30 of which the oscillation frequency is increased due to the proximity of the detected object containing metal.

Besides, it is noted that when it is suitable for the induction type proximity switch 2 which has an oscillation circuit 30 of which the oscillation frequency is increased due to the proximity of the detected object containing metal, the operation circuit 44 as the comparison part compares the detected oscillation frequency of the high frequency with the thresholds t21, t22 and t23 for instability detection, when the detected amplitude is below the thresholds for instability detection, the signal S2 in the instable range must be output, the thresholds t21, t22 and t23 for instability detection are thresholds set for the following conditions, i.e., the distance to the detected object M set for the corresponding oscillation frequency as a boundary of the instable detection range in the detected distance to the detected amplitude is the distance in the instable detection range in the detected distance.

Besides, the present invention is also suitable for the induction type proximity switch explained at the later paragraphs of embodiment 2. The induction type proximity switch has an oscillation circuit of which the oscillation frequency is reduced due to the proximity of the detected object containing metal.

In this case, specifically speaking, the detected oscillation frequency of the high frequency is compared with the threshold for instability detection, when the detected amplitude is over the threshold for instability detection, the signal S2 in the instable range is output and alarm is sent, the threshold for instability detection is the threshold set for the following condition, i.e., the distance to the detected object M set for the corresponding oscillation frequency as a boundary of the instable detection range in the detected distance is the distance in the instable detection range in the detected distance.

Embodiment 4

Another embodiment of the present invention is explained as follows. In addition, the constitution except for the description in embodiment 3 is same that in embodiments 1-3. Besides, for facilitating explanation, the components with the functions same as those of the components shown by the drawings of embodiments 1-3 are marked with the same numbers, and the description is omitted.

In the induction type proximity switch 1 in embodiment 1 and the induction type proximity switch 2 in embodiment 2, the proximity switch adopting the following oscillation circuit is explained, the oscillation circuit oscillates to generate a high frequency of which the physical quantity is changed corresponding to the distance to the detected object M and the amplitude is attenuated or oscillation frequency is increased or reduced.

However, for example, the proximity switch as mentioned below is known, which has one or more detection coils having a physical quantity changed according to the distance to the detected object M and increased voltage, and by detecting the voltage generated in the detection coils, the excessive proximity or instable detection range is detected.

In the present invention, such type of proximity switch having one or more detection coils and detecting the voltage generated in the detection coils can be preferably suitable for a pulse exciting type or differential coil type proximity switch which detects an induction voltage caused by eddy current flux.

Herein, the pulse exciting type proximity sensor is the proximity sensor as mentioned below, i.e., a pulse-shaped exciting current periodically flows by the detection coils, and the voltage generated by induction in the detection coils after blockage of the exciting current is used as a detection signal, for example, the case disclosed in the Japanese Patent laid open 2009-59528 gazette.

Besides, the differential coil type proximity sensor is the proximity sensor as mentioned below, the detection coils oscillate and the voltage difference generated by induction in a pair of detection coils is used as a detection signal, for example, the case disclosed in the Japanese Patent laid open 7-29466 gazette.

Specifically speaking, in the proximity switch of this embodiment, the specific range is the range that the distance to the detected object M reaches the excessive proximity, the comparison part compares the detected voltage with the threshold set for the corresponding voltage as a boundary of the specific range, i.e., the thresholds for excessive proximity, and the detection signal S1 for excessive proximity as the detection signal of the specific range is output when the detected amplitude is over the thresholds for excessive proximity.

Therefore, the proximity switch detects whether the distance to the detected object M is in range of excessive proximity.

At this point, the detection part detects the voltage output from the detection coil L. Further, the comparison part compares the detected voltage with the threshold set for the corresponding voltage as a boundary of the specific range, i.e., the thresholds for excessive proximity, and outputs the detection signal S1 for excessive proximity as the detection signal of the specific range. Herein, the threshold is the threshold for excessive proximity, corresponding to the metal type and provided from the threshold setting part.

As a result, in this embodiment, since the threshold for excessive proximity and corresponding to each metal type is used, the threshold for excessive proximity may not be the same voltage relative to multiple metals. Therefore, specific to multiple metals, the threshold for excessive proximity can be set in the detection range with high sensitivity in each metal to detect the excessive proximity.

Therefore, there is provided a proximity switch, which can detect excessive proximity in the detection range with high detection sensitivity for the detected object M, as a target, containing multiple metals under the condition that the physical quantity is voltage.

Besides, in the proximity switch of this embodiment, the specific range is the range that the distance to the detected object M is in the instable detection range in the detected distance, and the comparison part compares the detected voltage with the threshold set for the corresponding voltage as a boundary of the instable detection range in the detected distance, i.e., the threshold vales for instability detection, and outputs the signal in the instable range as the detection signal of the specific range when the detected voltage is under the threshold for instability detection.

At this point, the detection part detects the voltage output from the detection coil L. Further, the comparison part compares the detected voltage with the threshold set for the corresponding voltage as a boundary of the instable detection range in the detected distance, i.e., the threshold for instability detection, and outputs the signal in the instable range as the detection signal of the specific range when the detected voltage is over the threshold for instability detection. Herein, the threshold is the threshold for instability detection, corresponding to the metal type and provided from the threshold setting part.

As a result, in this embodiment, since the threshold for instability detection and corresponding to each metal type is used, the threshold for instability detection may be not the same voltage relative to the multiple metals. Therefore, specific to multiple metals, the threshold for instability detection can be set in the detection range with high detection sensitivity in each metal to detect the instable detection range.

Therefore, there is provided a proximity switch, which can detect the instable detection range in the detection range with high detection sensitivity for the detected object, as a target, containing multiple metals under the condition that the physical quantity is voltage.

What is claimed is:

1. A proximity switch, for detecting whether a detected object exists in a specific range through proximity of the detected object containing metal, the proximity switch comprising:
    a detection part, detecting a physical quantity which is changed according to a distance to the detected object;
    a comparison part, comparing the detected physical quantity with a threshold set for the physical quantity corresponding to a boundary of the specific range, and outputting a detection signal of the specific range when the detected object exists in the specific range;
    a threshold setting part, selecting a threshold corresponding to a metal type designated according to a designation on the metal type from the outside; and
    an oscillation circuit, oscillating to generate a high frequency, wherein an amplitude of the high frequency serving as the physical quantity is attenuated or a oscillation frequency serving as the physical quantity is increased or reduced due to the proximity of the detected object containing metal,
    wherein the detection part detects the amplitude or the oscillation frequency of the high frequency generated by the oscillation circuit, the specific range is a range that the distance to the detected object reaches an excessive proximity, and the comparison part compares the detected amplitude or oscillation frequency of the high frequency with a threshold for excessive proximity which is the threshold set for the amplitude or the oscillation frequency corresponding to a boundary of excessive proximity, when the detected amplitude is under the threshold for excessive proximity, or when the oscillation frequency detected under the condition that the oscillation frequency is increased along with the proximity of the detected object is over the threshold for excessive proximity, or when the oscillation frequency detected under the condition that the oscillation frequency is reduced along with the proximity of the detected object is under the threshold for excessive proximity, an excessive proximity detection signal serving as the detection signal of the specific range is output.

2. The proximity switch according to claim 1, wherein the thresholds in the threshold setting part are changed corresponding to the metal type, and a distance preset for excessive proximity or a distance preset for an instable detection range, and
    according to a designation for the metal type and the distance preset for excessive proximity or the distance preset for the instable detection range from the outside, a corresponding threshold for excessive proximity or a corresponding threshold for instability detection is set.

3. The proximity switch according to claim 1, comprising:
    a storage part, storing a plurality of combinations of the metal type and a distance preset for excessive proximity or a distance preset for an instable detection range, and a threshold for excessive proximity or a threshold for instability detection corresponding to each combination, and
    according to a designation of the combination of the metal type and the distance preset for excessive proximity or the distance preset for the instable detection range from the outside, the corresponding threshold for excessive proximity or threshold for instability detection is selected.

4. The proximity switch according to claim 1, wherein the threshold setting part is connected to a communication part for communication with the outside by using IO-Link communication.

5. The proximity switch according to claim 1, wherein the oscillation circuit adopts a soft oscillation manner that the amplitude of the high frequency during the excessive proximity of the detected object is kept in a nonstop state.

6. The proximity switch according to claim 1, characterized by being provided with:
    an alarm part, alarming when the comparison part outputs the detection signal of the specific range.

7. A proximity switch, for detecting whether a detected object exists in a specific range through proximity of the detected object containing metal, the proximity switch comprising:
    a detection part, detecting a physical quantity which is changed according to a distance to the detected object;
    a comparison part, comparing the detected physical quantity with a threshold set for the physical quantity corresponding to a boundary of the specific range, and outputting a detection signal of the specific range when the detected object exists in the specific range;
    a threshold setting part, selecting a threshold corresponding to a metal type designated according to a designation on the metal type from the outside; and
    an oscillation circuit, oscillating to generate a high frequency, wherein an amplitude of the high frequency serving as the physical quantity is attenuated or a oscillation frequency serving as the physical quantity is increased or reduced due to the proximity of the detected object containing metal,
    wherein the detection part detects the amplitude or the oscillation frequency of the high frequency generated by the oscillation circuit, the specific range is a range that the distance to the detected object becomes an excessive proximity detection range in a detection distance, and the comparison part compares the detected amplitude or oscillation frequency of the high frequency with a threshold for excessive proximity detection which is the threshold set for the amplitude or oscillation frequency corresponding to a boundary of the excessive proximity detection range in the detection distance, when he detected amplitude is over the threshold for excessive proximity detection, or when the oscillation frequency detected under the condition that the oscillation frequency is increased along with the proximity of the detected object is under the threshold for excessive proximity detection, or when the oscillation frequency detected under the condition that the oscillation frequency is reduced along with the proximity of the detected object is over the threshold for excessive proximity detection, a signal of being within an excessive proximity range serving as the detection signal of the specific range is output.

8. A proximity switch, for detecting whether a detected object exists in a specific range through proximity of the detected object containing metal, the proximity switch comprising:
  a detection part, detecting a physical quantity which is changed according to a distance to the detected object;
  a comparison part, comparing the detected physical quantity with a threshold set for the physical quantity corresponding to a boundary of the specific range, and outputting a detection signal of the specific range when the detected object exists in the specific range;
  a threshold setting part, selecting a threshold corresponding to a metal type designated according to a designation on the metal type from the outside; and
  one or more detection coils, wherein a voltage serving as the physical quantity is increased due to the proximity of the detected object containing metal, the detection part detects the voltage generated in the detection coil,
  wherein the specific range is a range that the distance to the detected object reaches an excessive proximity,
  the comparison part compares the detected voltage with a threshold for excessive proximity which is the threshold set for the voltage corresponding to a boundary of the excessive proximity, when the detected amplitude is over the threshold for excessive proximity, an excessive proximity detection signal serving as the detection signal of the specific range is output.

9. A proximity switch, for detecting whether a detected object exists in a specific range through proximity of the detected object containing metal, the proximity switch comprising:
  a detection part, detecting a physical quantity which is changed according to a distance to the detected object;
  a comparison part, comparing the detected physical quantity with a threshold set for the physical quantity corresponding to a boundary of the specific range, and outputting a detection signal of the specific range when the detected object exists in the specific range;
  a threshold setting part, selecting a threshold corresponding to a metal type designated according to a designation on the metal type from the outside; and
  one or more detection coils, wherein a voltage serving as the physical quantity is increased due to the proximity of the detected object containing metal, the detection part detects the voltage generated in the detection coil,
  wherein the specific range is a range that the distance to the detected object becomes an excessive proximity detection range in a detection distance, and
  the comparison part compares the detected voltage with a threshold for excessive proximity detection which is the threshold set for the voltage corresponding to a boundary of the excessive proximity detection range in the detection distance, when the detected voltage is under the threshold for excessive proximity detection, a signal of being within the excessive proximity range serving as the detection signal of the specific range is output.

* * * * *